(12) United States Patent
Ahmed et al.

(10) Patent No.: US 6,611,029 B1
(45) Date of Patent: Aug. 26, 2003

(54) DOUBLE GATE SEMICONDUCTOR DEVICE HAVING SEPARATE GATES

(75) Inventors: Shibly S. Ahmed, San Jose, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/290,158

(22) Filed: Nov. 8, 2002

(51) Int. Cl.[7] .......................... H01L 29/76; H01L 29/94; H01L 31/062; H01L 31/113
(52) U.S. Cl. ................... 257/365; 257/347; 257/353; 257/366; 257/401
(58) Field of Search ................... 257/347, 352, 257/353, 365, 366, 401

(56) References Cited

U.S. PATENT DOCUMENTS

| | | | | |
|---|---|---|---|---|
| 5,315,143 A | * | 5/1994 | Tsuji | 257/351 |
| 6,396,108 B1 | * | 5/2002 | Krivokapic et al. | 257/365 |
| 6,483,171 B1 | * | 11/2002 | Forbes et al. | 257/627 |

OTHER PUBLICATIONS

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

U.S. application Ser. No. 10/290,330, filed Nov. 8, 2002, entitled "Double–Gate Semiconductor Device," Bin Yu et al., 20 page specification, 11 sheets of drawings.

U.S. application Ser. No. 10/348,758, filed Jan. 23, 2003, entitled "Germanium MOSFET Devices and Methods for Making Same," Judy Xilin An et al., 22 page specification, 29 sheets of drawings.

\* cited by examiner

Primary Examiner—Ngân V. Ngô
(74) Attorney, Agent, or Firm—Harrity & Snyder, LLP

(57) ABSTRACT

A semiconductor device may include a substrate and an insulating layer formed on the subtrate. A fin may be formed on the insulating layer and may include a number of side surfaces and a top surface. A first gate may be formed on the insulating layer proximate to one of the number of side surfaces of the fin. A second gate and may be formed on the insulating layer separate from the first gate and proximate to another one of number of side surfaces of the fin.

15 Claims, 8 Drawing Sheets

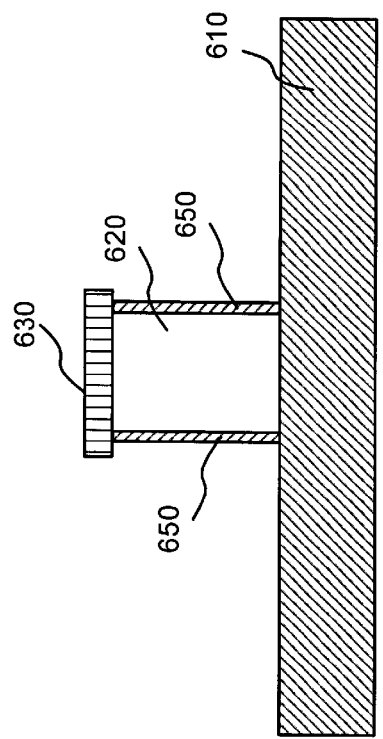
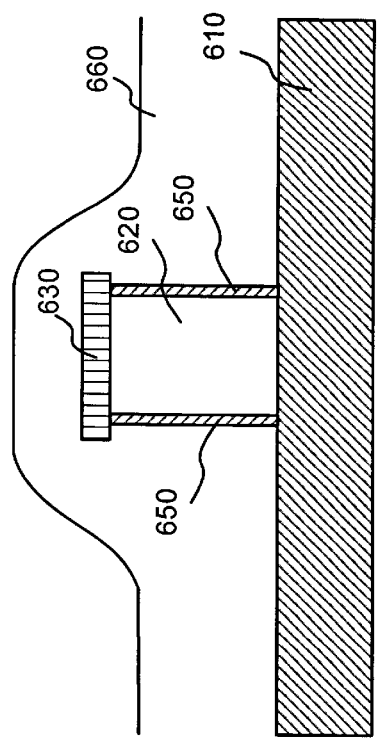
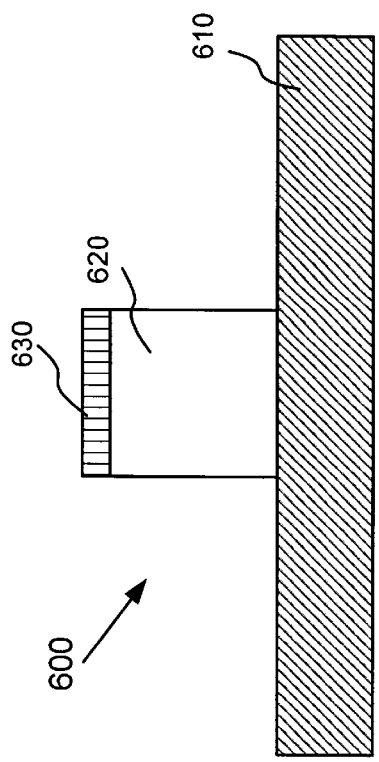
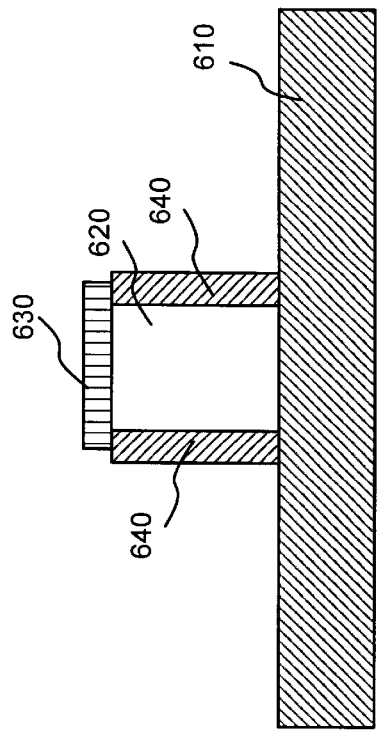

DOUBLE GATE SEMICONDUCTOR DEVICE HAVING SEPARATE GATES

TECHNICAL FIELD

The present invention relates to semiconductor devices and methods of manufacturing semiconductor devices. The present invention has particular applicability to double-gate devices.

BACKGROUND ART

The escalating requirements for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. Although conventional FinFETs are referred to as "double-gate" MOSFETs, the two gates typically are physically and electrically connected and thus form a single logically addressable gate. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a FinFET device with two gates that are effectively separated from each other by a conductive fin. The gates may be independently biased for increased circuit design flexibility.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device including a substrate and an insulating layer formed on the substrate. A fin may be formed on the insulating layer and may include a number of side surfaces and a top surface. A first gate may be formed on the insulating layer proximate to one of number of side surfaces of the fin. A second gate may be formed on the insulating layer separate from the first gate and proximate to another one of number of side surfaces of the fin.

According to another aspect of the invention, a method of manufacturing a semiconductor device may include forming an insulating layer on a substrate and forming a fin structure on the insulating layer. The fin structure includes a first side surface, a second side surface, and a top surface. The method may also include forming source and drain regions at ends of the fin structure and depositing a gate material over the fin structure. The gate material surrounds the top surface and the first and second side surfaces. The gate material may be etched to form a first gate electrode and a second gate electrode on opposite sides of the fin. The deposited gate material may be planarized proximate to the fin.

According to a further aspect of the invention a semiconductor device may include a substrate and an insulating layer formed on the substrate. A conductive fin may be formed on the insulating layer, and gate dielectric layers may be formed on side surfaces of the conductive fin. A first gate electrode may be formed on the insulating layer. The first gate electrode may be disposed on a first side of the conductive fin adjacent to one of the gate dielectric layers. A second gate electrode may be formed on the insulating layer. The second gate electrode may be disposed on an opposite side of the conductive fin adjacent to another one of the gate dielectric layers and spaced apart from the first gate electrode.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 6A–6D are cross-sections illustrating the induction of tensile strain in a fin in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide double gate FinFET devices and methods of manufacturing such devices. The gates in the FinFET devices formed in accordance with the present invention are effectively separated from each other and may be separately biased.

Figure 1:
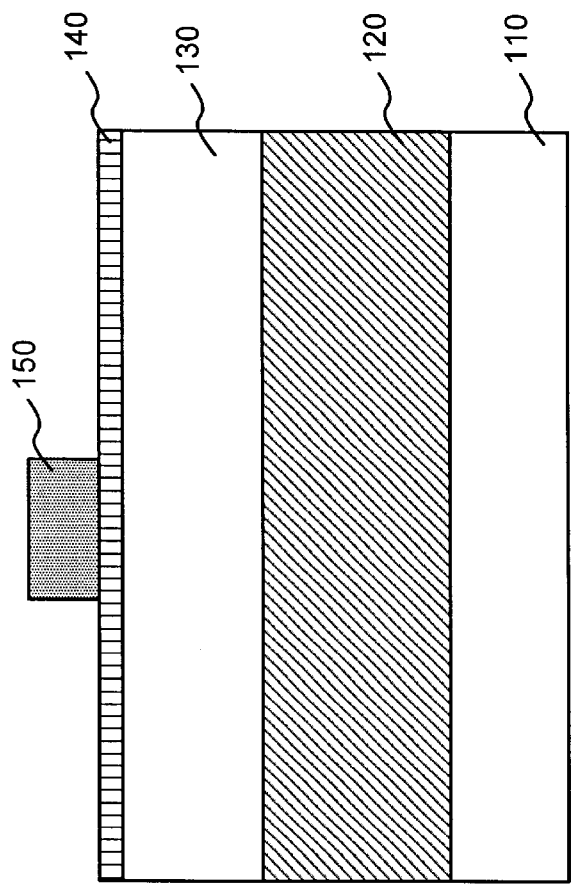
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be deposited at a thickness ranging from about 150 Å to about 600 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions.

Figure 2A:
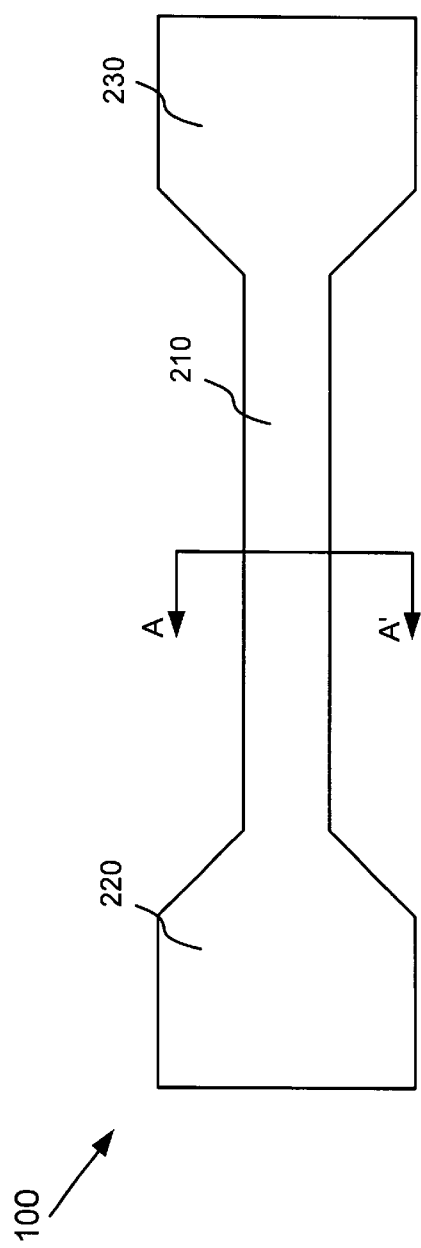
FIG. 2A schematically illustrates the top view of a fin structure in accordance with an exemplary embodiment of the present invention.

FIG. 2A schematically illustrates the top view of a fin structure on semiconductor 100 formed in such a manner. Source region 220 and drain region 230 may be formed adjacent the ends of fin 210 on buried oxide layer 120, according to an exemplary embodiment of the present invention.

Figure 2B:
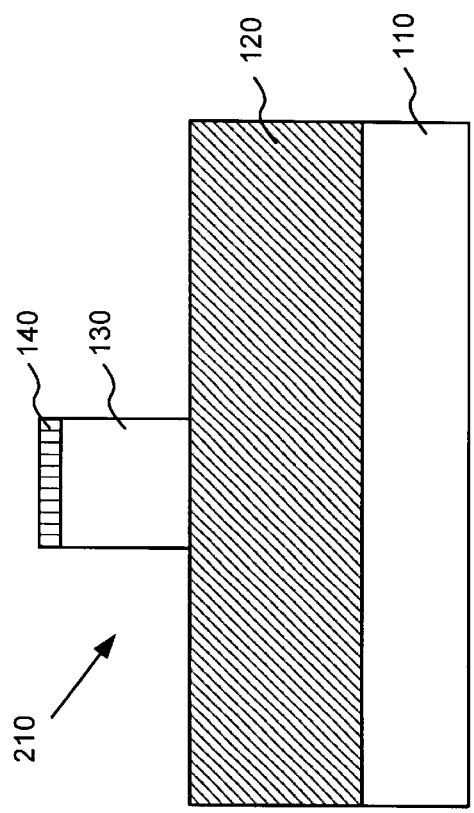
FIG. 2B is a cross-section illustrating the fin structure of FIG. 2A in accordance with an exemplary embodiment of the present invention.

FIG. 2B is a cross-section along line A–A' in FIG. 2A illustrating the fin structure in accordance with an exemplary embodiment of the present invention. Dielectric layer 140 and silicon layer 130 have been etched to form fin 210. Fin 210 may include silicon 130 and a dielectric cap 140.

Figure 3:
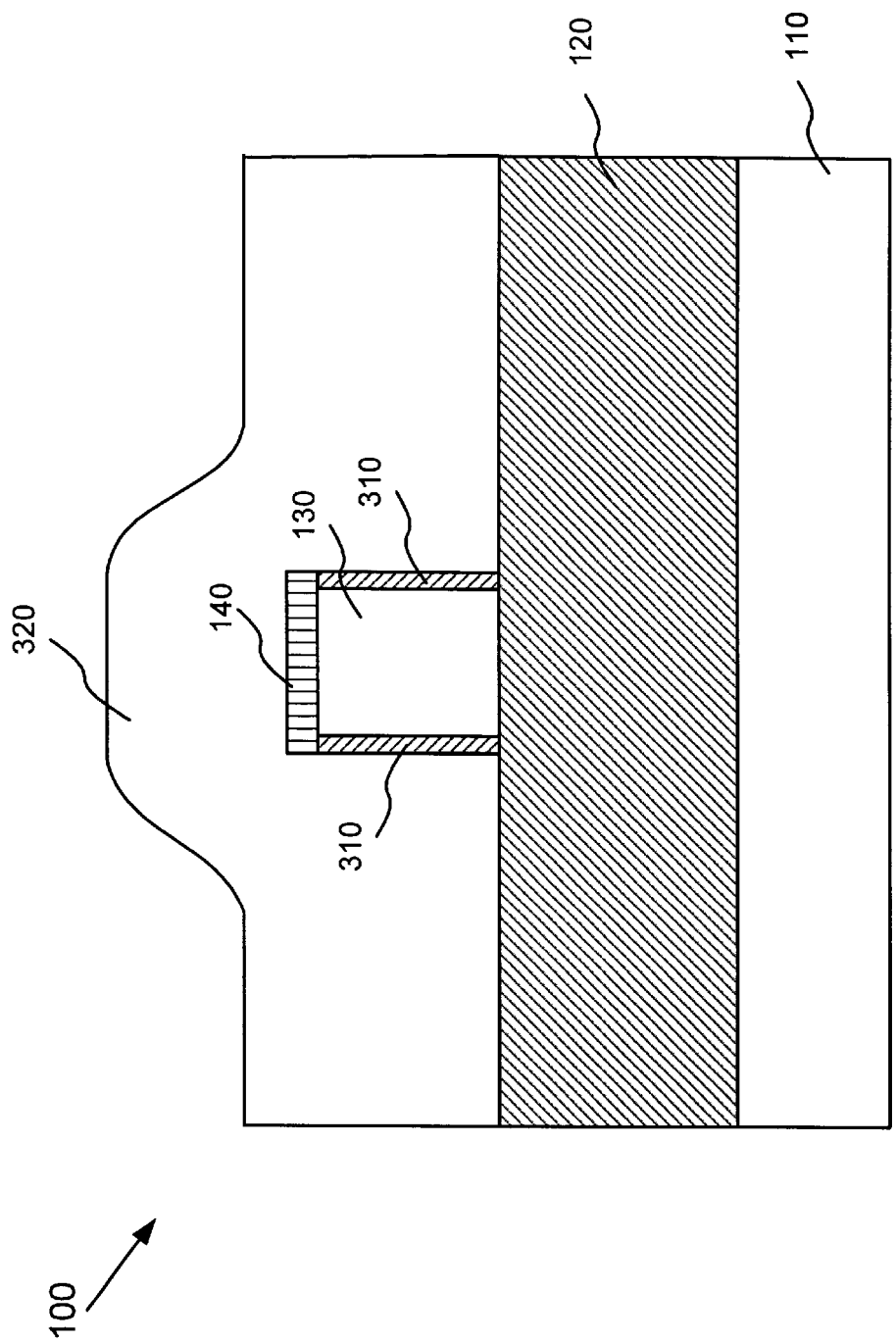
FIG. 3 is a cross-section illustrating the formation of a gate dielectric layer and gate material on the device of FIG. 2B in accordance with an exemplary embodiment of the present invention.
Figure 4:
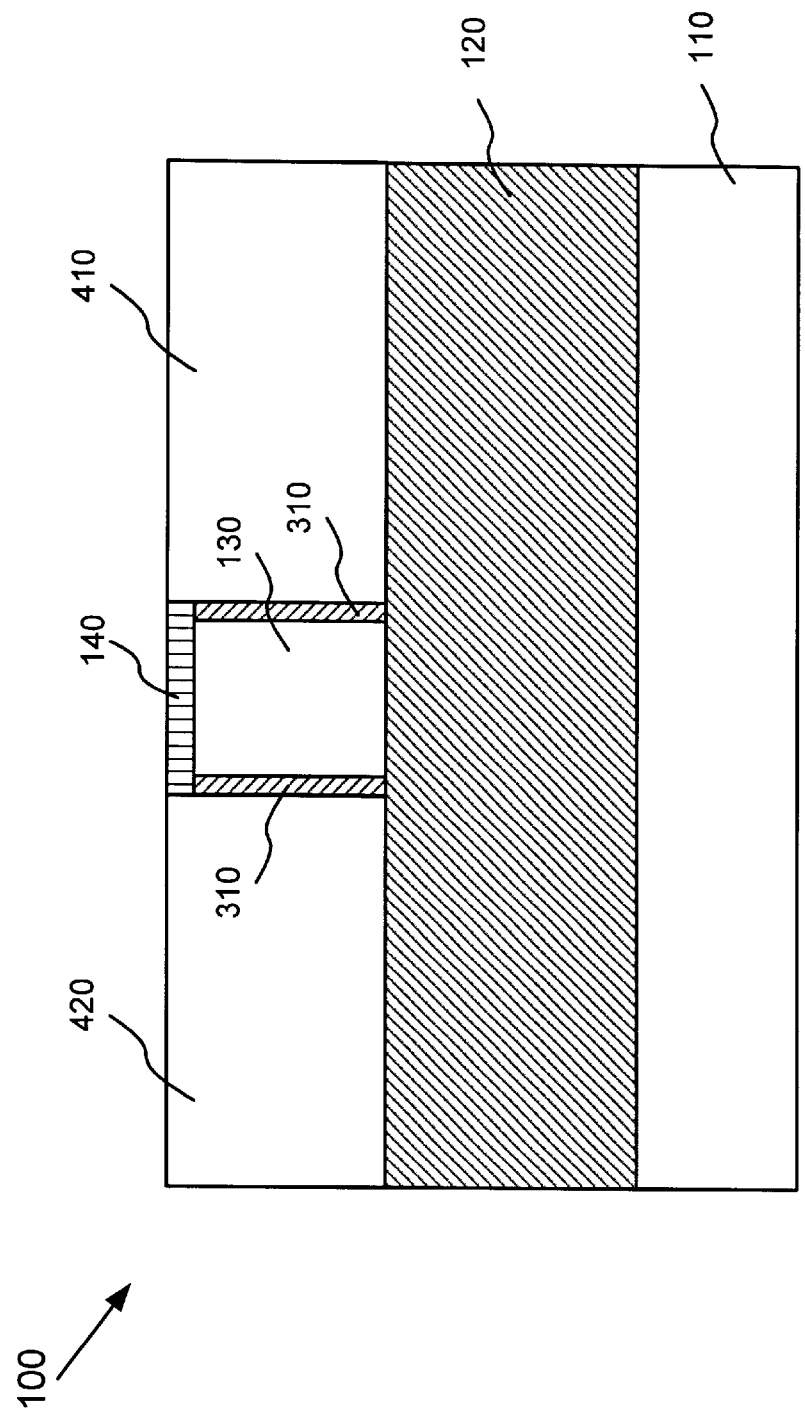
FIG. 4 is a cross-section illustrating the planarizing of the gate material of FIG. 3 in accordance with an exemplary embodiment of the present invention.

FIG. 3 is a cross-section illustrating the formation of a gate dielectric layer and gate material on fin 210 in accordance with an exemplary embodiment of the present invention. A dielectric layer may be formed on fin 210. For example, a thin oxide film 310 may be thermally grown on fin 210, as illustrated in FIG. 4. The oxide film 310 may be grown to a thickness of about 10 Å to about 50 Å and may be formed on the exposed side surfaces of silicon 130 in fin 210 to act as a dielectric layer for a subsequently formed gate electrode. Similar to the oxide film 310, the dielectric cap 140 may provide electrical insulation for the top surface of fin 210.

A gate material layer 320 may be deposited over semiconductor device 100 after formation of the oxide film 310. The gate material layer 320 may comprise the material for the subsequently formed gate electrode. In an exemplary implementation, the gate material layer 320 may include polysilicon deposited using conventional chemical vapor deposition (CVD) to a thickness ranging from about 300 Å to about 1500 Å. Alternatively, other semiconducting materials, such as germanium or combinations of silicon and germanium, or various metals may be used as the gate material.

Two gates may be defined in the gate material layer 320 by lithography (e.g., photolithography). Gate material layer 320 may be selectively etched to form a gate structure out of the gate material layer 320 on device 100. Forming the gate structure in such a manner may leave some gate material 320 on top of the dielectric cap 140, for example as illustrated in FIG. 3.

FIG. 4 is a cross-section illustrating the planarizing of the gate material 320 in accordance with an exemplary embodiment of the present invention. Excess gate material may be removed (e.g., from above the dielectric cap 140) to planarize the fin region of the semiconductor device 100. For example, chemical-mechanical polishing (CMP) may be performed so that the gate material (i.e., layer 320) is even with or nearly even with dielectric cap 140 in the vertical direction, as illustrated in FIG. 4.

Figure 5:
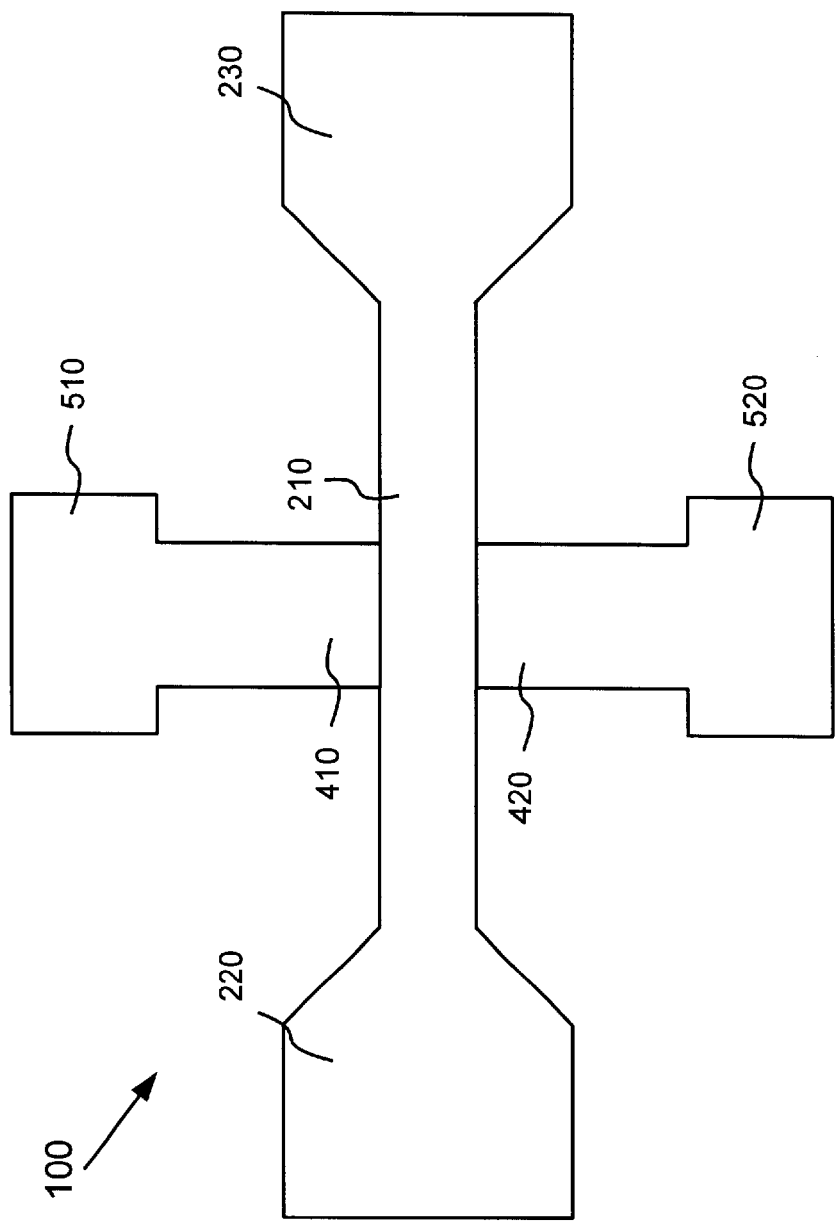
FIG. 5 schematically illustrates the top view of the semiconductor device of FIG. 4 in accordance with an exemplary embodiment of the present invention.

Referring to FIG. 4, the gate material layer 320 in the channel region of semiconductor device 100 abuts fin 210 on the two side surfaces to form a first gate 410 and a second gate 420. The top surface of fin 210, however, is covered by dielectric cap 140. This structure is also shown in FIG. 5, which illustrates a top view of semiconductor device 100 consistent with the present invention. In FIG. 5, first gate 410 and second gate 420 are shown adjacent, but not covering, fin 210.

The gate material layer 320 may then be patterned and etched to form two gate electrodes. As illustrated in FIG. 5, semiconductor device 100 includes a double gate structure with gate electrodes 510 and 520. Gate electrodes 510 and 520 are effectively separated by fin 210 and may be separately biased, as discussed in more detail below. The gate dielectric 310 (FIG. 4) surrounding the side surfaces of fin 210 is not shown in FIG. 5 for simplicity.

The source/drain regions 220 and 230 may then be doped. For example, n-type or p-type impurities may be implanted in source/drain regions 220 and 230. The particular implantation dosages and energies may be selected based on the particular end device requirements. One or ordinary skill in this art would be able to optimize the source/drain implantation process based on the circuit requirements and such steps are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

As illustrated in FIG. 5, gate electrode 510 and gate electrode 520 are physically and electrically separated from each other. In accordance with an exemplary embodiment of the present invention, each of the gate electrodes 510 and 520 may be separately biased with different voltages when used in a circuit. The capability for independently biasing the gates 410 and 420 (via gate electrodes 510 and 520) increases the flexibility of circuit design using semiconductor device 100.

The resulting semiconductor device 100 illustrated in FIG. 5 is a double gate device with a first gate 410 and a second gate 420. The gate material layer 320 (FIGS. 3 and 4) abuts two surfaces of fin 210 and provides semiconductor device 100 with increased channel width per device, as compared to a conventional double gate device. The fin 210 may also retain the dielectric cap 140 that protects the fin 210 during gate etching.

The gates 410 and 420 are also effectively separated by fin 210 and may be separately biased (via respective gate electrodes 510 and 520) based on the particular circuit requirements of device 100. This separate double gate structure provides increased flexibility during circuit design, as opposed to conventional FinFETs which include a single gat connection.

Thus, in accordance with the present invention, a double-gate FinFET device is formed with two separate gates in the channel region of the device. Advantageously, the resulting structure exhibits good short channel behavior. In addition, the present invention provides increased flexibility and can be easily integrated into conventional processing.

OTHER IMPLEMENTATIONS

In some implementations, it may be desirable to induce tensile strain in the fin of a FinFET. FIGS. 6A–6D are cross-sections illustrating the induction of tensile strain in a fin in accordance with another implementation of the present invention. FIG. 6A illustrates the cross-section of a semiconductor device 600. Referring to FIG. 6A, device 600 may include a buried oxide (BOX) layer 610, a fin 620, and an SiO$_2$ cap 630. Elements 610–630 may be formed as described above with respect to FIGS. 1–2B. Fin 620 may include silicon, germanium or a combination of silicon and germanium.

A thick sacrificial oxide layer 640 may be thermally grown on fin 620 as shown in FIG. 6B. Growing the thick (e.g., 200–400 Å) sacrificial oxide layer 640 may induce a tensile strain in fin 620. The sacrificial oxide layer 640 may then be removed, and a thin gate oxide layer 650 may be grown, as illustrated in FIG. 6C. Gate material 660 may then be deposited over the fin 620 as shown in FIG. 6D. A FinFET may be formed from the structure in FIG. 6D in a typical manner. The fin 620 in such a FinFET will have a tensile strain, imparting qualities to the fin 620 that will be understood by those skilled in the art.

Figure 7B:
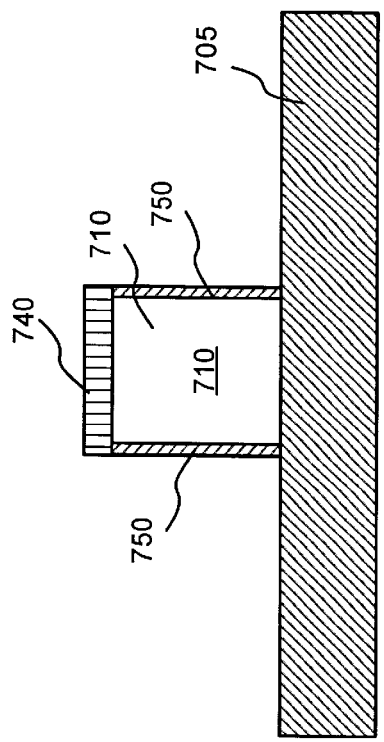
FIGS. 7A–7F are top and cross-sectional views illustrating formation of a fully silicided gate in a FinFET in accordance with another implementation of the present invention.
Figure 7D:
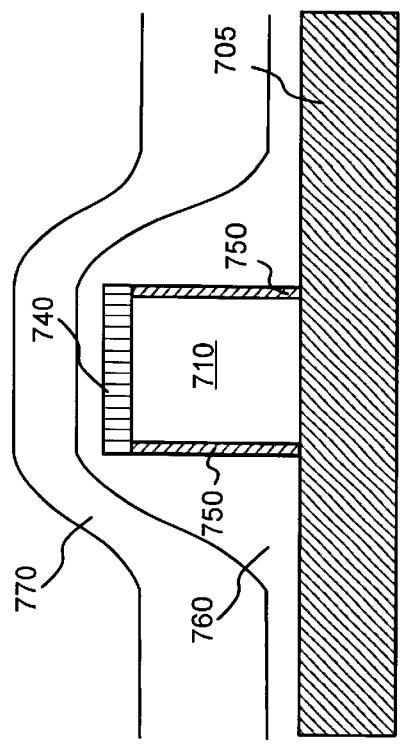
Figure 7A:
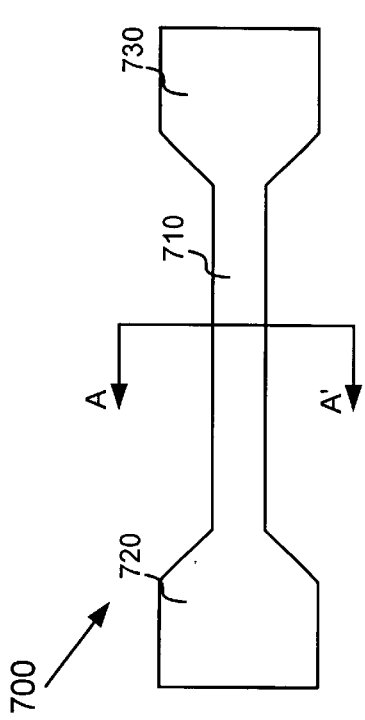

In other implementations, a FinFET with a fully silicided gate may be desired. Such a FinFET may have an incorporated metal gate that removes a polysilicon depletion effect and helps to achieve a proper threshold voltage for the FinFET. FIGS. 7A and 7B are views illustrating exemplary processing for forming a FinFET with a fully silicided gate. Referring to FIG. 7A, device 700 includes a fin 710, source region 720, and drain region 730. These layers/structures may be formed as described above with respect to FIGS. 1–2B. As shown in FIG. 7B, fin 710 may include a top oxide cap 740 and gate oxide 750 surrounding a silicon structure. Fin 710 may be formed on a buried oxide (BOX) layer 705.

Figure 7C:
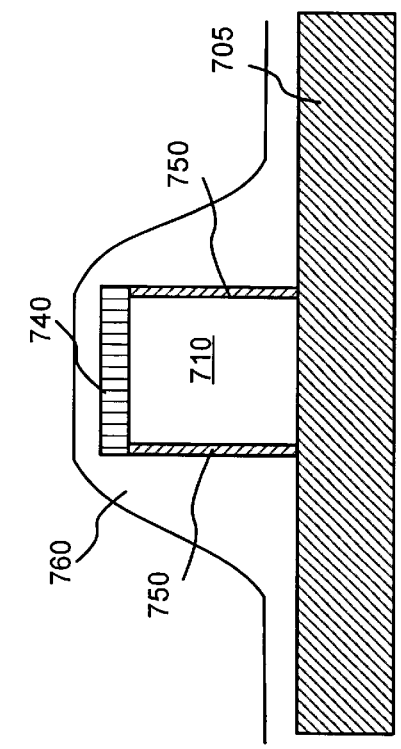

A thin polysilicon layer 760 may be deposited on the fin 710, as shown in FIG. 7C. Then a thick bottom antireflective (BARC) layer 770 may be deposited, as shown in FIG. 7D. The gate region and contacts 780 may then be patterned and etched as shown from the top in FIG. 7E.

Source and drain regions 720 and 730 may be implanted with ions without removing the BARC layer 770. Thus, the dopants used will be stopped by the BARC layer 770 from penetrating into the channel (e.g., fin 710).

Figure 7F:
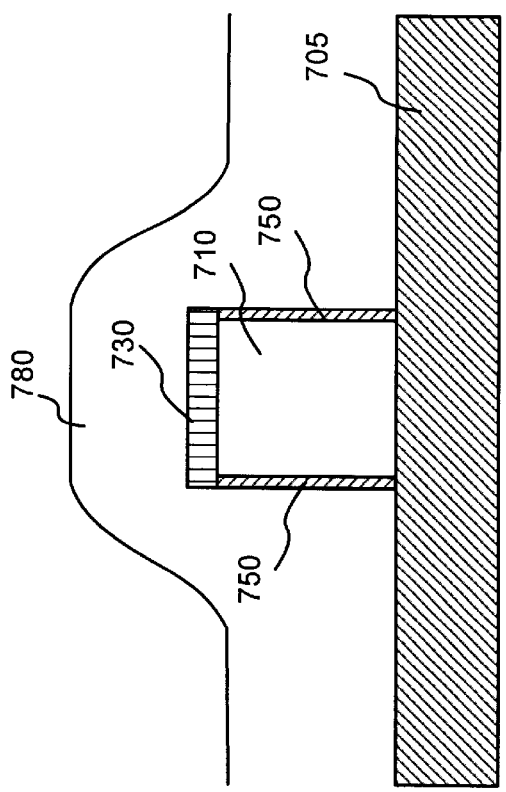
Figure 7E:
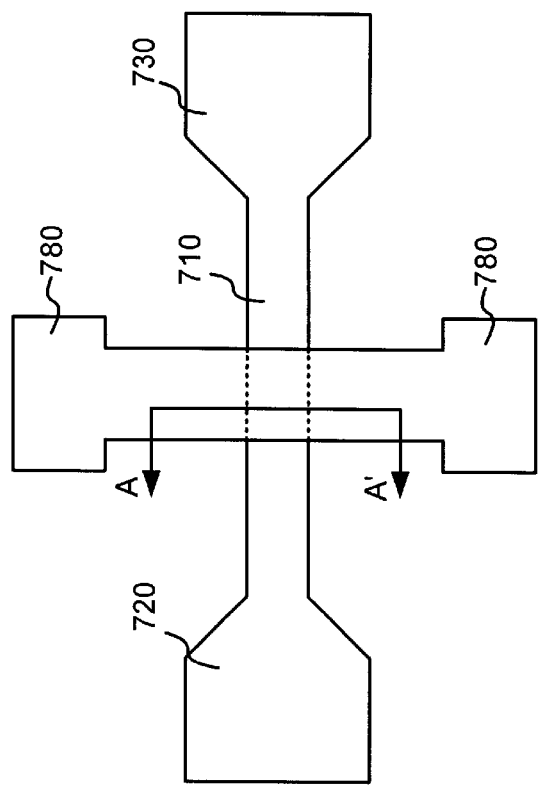

BARC layer 770 may be removed, and the polysilicon 760 is fully silicided to form a metal gate 780, as illustrated in FIGS. 7E and 7F. The gate material 710 may also be planarized in a manner similar to that described above with respect to FIG. 4.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of double-gate semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device, comprising:
   a substrate;
   an insulating layer formed on the substrate;
   a fin formed on the insulating layer and including a plurality of side surfaces and a top surface;
   a first gate formed on the insulating layer proximate to one of plurality of side surfaces of the fin; and
   a second gate formed on the insulating layer separate from the first gate and proximate to another one of plurality of side surfaces of the fin.

2. The semiconductor device of claim 1 wherein the second gate is formed at an opposite side of the fin from the first gate.

3. The semiconductor device of claim 2, wherein the first and second gates respectively include first and second gate contacts.

4. The semiconductor device of claim 1, further comprising:
a plurality of dielectric layers respectively formed along the plurality of side surfaces of the fin.

5. The semiconductor device of claim 4, wherein the first and second gates respectively abut different ones of the plurality of dielectric layers.

6. The semiconductor device of claim 1, wherein the fin comprises at least one of silicon and germanium.

7. The semiconductor device of claim 1, wherein the insulating layer comprises a buried oxide layer.

8. The semiconductor device of claim 1, further comprising:
a source region and a drain region formed above the insulating layer and adjacent a respective first and second end of the fin.

9. The semiconductor device of claim 1, further comprising:
a dielectric layer comprising at least one of a nitride and an oxide formed over the top surface of the fin.

10. The semiconductor device of claim 9, wherein a top surface of the dielectric layer, a top surface of the first gate, and a top surface of the second gate are substantially coplanar.

11. A semiconductor device, comprising:
a substrate;
an insulating layer formed on the substrate;
a conductive fin formed on the insulating layer;
gate dielectric layers formed on side surfaces of the conductive fin;
a first gate electrode formed on the insulating layer, the first gate electrode disposed on a first side of the conductive fin adjacent one of the gate dielectric layers; and
a second gate electrode formed on the insulating layer, the second gate electrode disposed on an opposite side of the conductive fin adjacent another one of the gate dielectric layers and spaced apart from the first gate electrode.

12. The semiconductor device of claim 11, further comprising:
a dielectric cap formed over a top surface of the conductive fin.

13. The semiconductor device of claim 12, wherein neither of the first gate electrode and the second gate electrode extend over the dielectric cap.

14. The semiconductor device of claim 12, wherein top surfaces of the first gate electrode, the second gate electrode, and the dielectric cap are substantially coplanar.

15. The semiconductor device of claim 11, wherein the first gate electrode and the second gate electrode are aligned on opposite sides of the conductive fin and are not electrically connected to each other.

* * * * *